Figure 1:
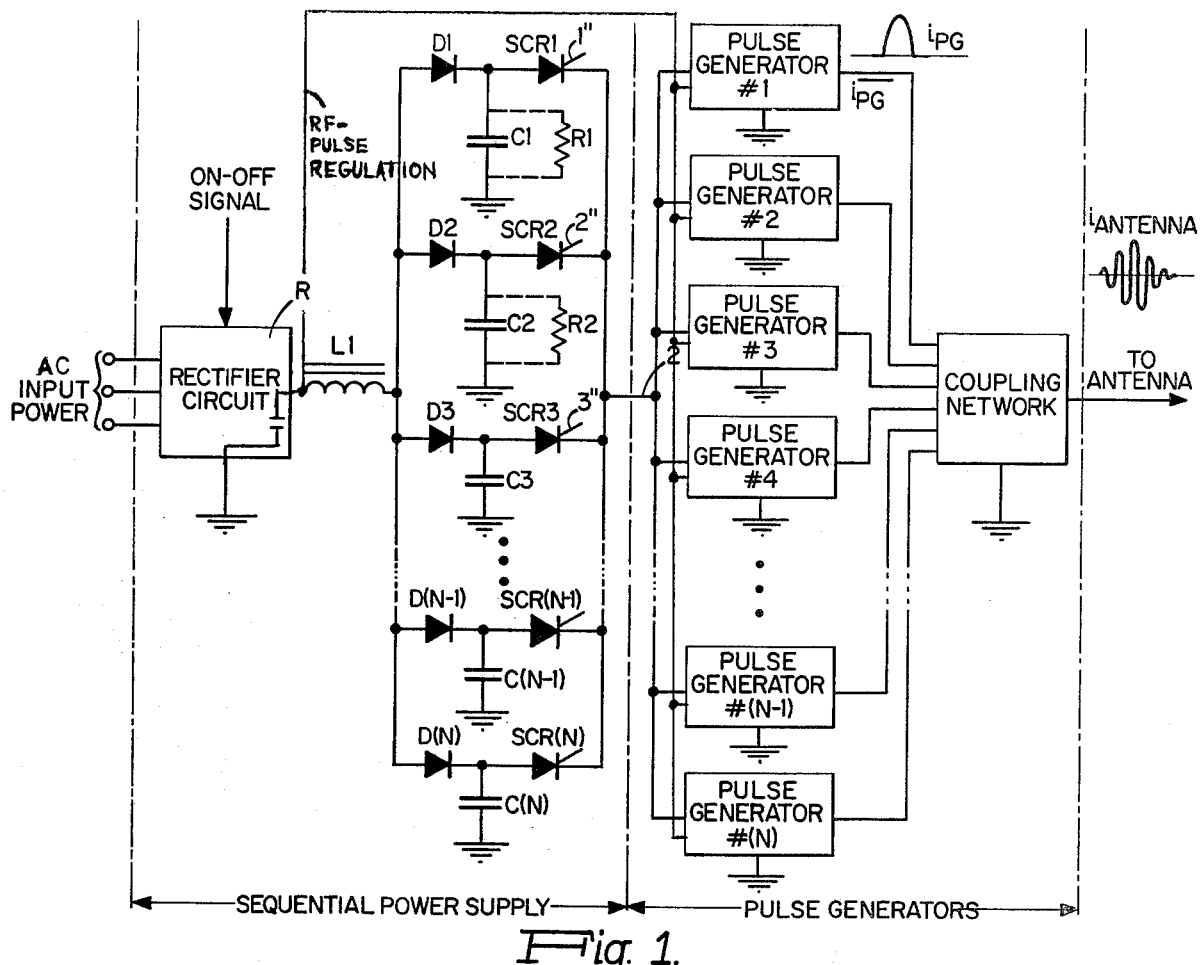

United States Patent [19]

Johannessen

[11] 4,001,598
[45] Jan. 4, 1977

[54] SEQUENTIAL POWER SUPPLY AND METHOD FOR RF PULSE GENERATION

[75] Inventor: Paul R. Johannessen, Lexington, Mass.

[73] Assignee: Megapulse, Inc., Bedford, Mass.

[22] Filed: Dec. 29, 1975

[21] Appl. No.: 644,623

[52] U.S. Cl. .............................. 307/106; 343/103
[51] Int. Cl.² ........................................ H03K 3/00
[58] Field of Search ............ 307/43, 106, 107, 108, 307/11, 18, 109, 110, 252 Q, 246; 328/59, 60, 61, 62, 66, 67, 75, 78, 106; 343/103

[56] References Cited
UNITED STATES PATENTS

| | | | |
|---|---|---|---|
| 3,666,964 | 5/1972 | Flynn | 307/108 |
| 3,711,725 | 1/1973 | Johannessen | 307/108 |
| 3,786,334 | 1/1974 | Johannessen | 321/45 R |
| 3,889,263 | 6/1975 | Johannessen | 331/49 X |

Primary Examiner—James R. Scott
Assistant Examiner—Morris Ginsburg
Attorney, Agent, or Firm—Rines and Rines

[57] ABSTRACT

This disclosure relates to the generation of RF pulses, generally in groups of pulses, through the use of a plurality of sequentially discharged power supplies, the successive discharge bursts of which are fed to a plurality of successive cycle-producing pulse generators, also sequentially triggered to generate a predetermined number of cycles of RF pulse for each such burst.

16 Claims, 3 Drawing Figures

SEQUENTIAL POWER SUPPLY AND METHOD FOR RF PULSE GENERATION

The present invention relates to apparatus for and methods of supplying power to radio-frequency (RF) pulse generative systems and the like, being more particularly directed to a novel concept of sequential power supply for enabling the generation of groups of RF pulses, such as those useful in Loran and similar navigation systems, though also applicable to other alternating-current pulse generating systems as well.

Considering the illustrative and preferred application of the invention to systems such as Loran type RF transmitters and the like, as described, for example, in my earlier U.S. Pat. Nos. 3,711,725; 3,786,334; and 3,889,263, the pulse amplitudes during the group of RF pulses may tend to decrease during the group as a result of the limited storage capacity of the DC power supplies. While this problem can be obviated by means of well-known regulators of the shunt or series or combination types, systems of this type do require the use of electrolytic capacitors to obtain adequate energy storage, with attendant unreliablity and relatively poor storage life, and require complex regulating systems. Such techniques thus have serious disadvantages where particularly high reliability and shelf life are required.

An object of the present invention, accordingly, is to provide a new and improved method of and apparatus for such RF or related pulse generation that involves none of these disadvantages, and that, to the contrary, through a novel sequential power supply technique, avoids pulse droop phenomena. A further object is to provide a novel sequential power supply for RF pulse group formation of more general applicability, as well.

Other and further objects will be pointed out hereinafter, and are more specifically delineated in the appended claims.

In accordance with the invention, indeed, the energy may be stored in paper or plastic film type capacitors of high reliability as well as electrolytic type capacitors, and no regulation is required to prevent pulse droop. In summary, this end is achieved by a method of RF pulse generation, that comprises, charging a plurality of energy storage sources; sequentially discharging the sources to provide successive energy bursts; simultaneously transferring the energy of each burst to a further plurality of energy storage sources; and, following such transfer, sequentially discharging the further energy storage sources to generate successive cycles of an overall RF pulse corresponding to each burst.

Figure 2:
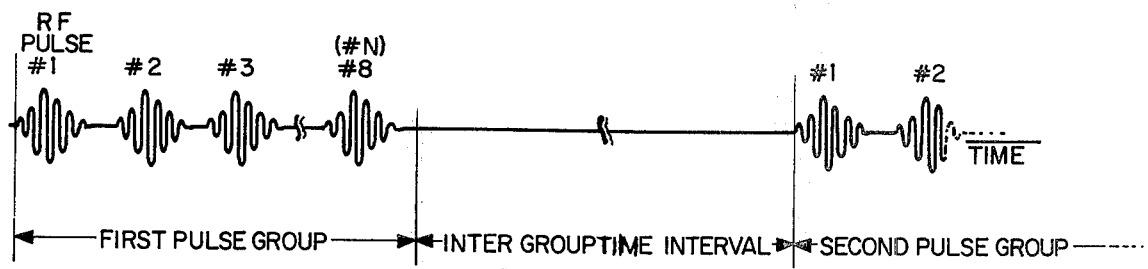
Figure 3:
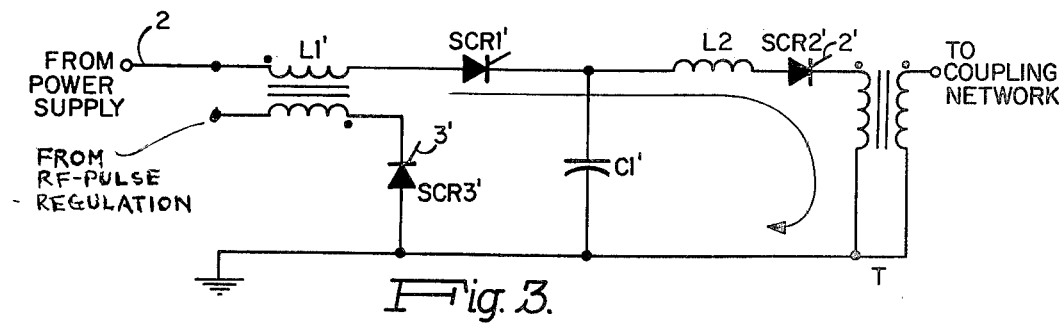

The invention will now be described with reference to the accompanying drawings, FIG. 1 of which is a combined block and schematic circuit diagram illustrating the invention as applied in preferred form to Loran pulse generation and the like;

FIG. 2 is a graphic waveform diagram of the pulse generation of the system of FIG. 1; and FIG. 3 is a circuit diagram of a preferred cycle pulse generator for use in said system.

Referring to FIG. 1, the apparatus is shown embodying a rectifier circuit R, a charging inductor $L_1$, a plurality N of parallel power supply circuits each consisting of a series diode, a shunt capacitor and an output gated series thyristor. The diodes are labeled $D_1$ through $D_N$. The capacitors are labeled $C_1$ through $C_N$, and the thyristors are labeled $SCR_1$ through $SCR_N$. The number of parallel power supply branches N is equal to the number of RF pulses desired in a group.

The output of this sequential power supply is connected to a plurality N of cycle (or half cycle) pulse generators, numbered 1 through N, as of types later described. These pulse generators, together with a common output coupling network, to which they are connected, generate the desired RF antenna current. The pulse generators may, for example, be of the SCR type or the combination SCR-magnetic type as described in said U.S. Pat. No. 3,889,263, and including the type later discussed in connection with the embodiment of FIG. 3.

In operation, the rectifier circuit R, preferably full-wave of either three or more phases, is turned on in the beginning of the group time interval, as shown in FIG. 2. This time interval is usually considerably longer then the pulse group interval for Loran type systems, as an example. The rectifier circuit will simultaneously charge the capacitors $C_1$ through $C_N$ to the same voltage. When the desired capacitor voltage is reached, the rectifier circuit R is turned off. In some applications, no turn-off signal is required because voltage regulation may be performed in the pulse generators. The primary objective of a turn-off signal is to regulate against AC line voltage variations. Capacitor $C_1$ will store energy for RF pulse # 1 of FIG. 2; capacitor $C_2$ stores energy for RF pulse # 2; and so on. In order that all the pulses in a group have the same amplitude, capacitors $C_1$ through $C_N$ are adjusted to have the same capacitance value. Thus, the deviation in pulse amplitude in a group is only a function of capacitance tolerance.

It is evident that the number of parallel branches in the sequential power supply must be at least equal to the number of pulses desired in a group. However, in case of failure, it is of advantage to have some spare branches, such as N-1 and N, for example, that can replace failed branches.

The generation of the first RF pulse is initiated by transferring the energy stored in $C_1$ of the first power supply to charge the pulse generators prior to the start of RF pulse # 1. This is done by turning $SCR_1$ on at time 1″ so that the energy in $C_1$ is discharged or transferred, via conductor 2 and ground, as a burst to successive cycle pulse generators 1 through N simultaneously. The term "cycle" generally embraces complete, half or other portions of a cycle of the intended RF or other alternating-current frequency desired. Similarly, prior to the start of RF pulse # 2, $SCR_2$ is sequentially next turned on, again transferring energy from $C_2$ as a succeeding burst to the pulse generators 1 through N; and so on. This process repeats until a complete pulse group is generated. It should be noted that since the diodes $D_1$ through $D_N$ and the gating thyristors or the like $SCR_1$ through $SCR_N$ isolate each parallel branch, it is thus possible sequentially to charge the pulse generators in the manner described above.

Since all the capacitors $C_1 - C_N$ in the sequential power supply are charged simultaneously, but discharged sequentially, schematically illustrated by the numbers 1″, 2″, 3″, etc. at the corresponding trigger electrodes, the storage time for capacitor $C_1$ is less than that of capacitor $C_2$, which is less than that of $C_3$, and so forth. In other words, capacitor $C_N$ must hold the charge considerably longer than capacitor $C_1$. Because of current leakage through the semi-conductor diodes and thyristors, however, more charge may leak off the higher numbered capacitors than the lower numbered capacitors which could result in pulse droop. This can be, however, readily compensated for by connecting resistors, schematically illustrated at $R_1$ and $R_2$, for example, etc. of different resistance value across each capacitor such that the energy leakage is the same for all capacitors.

Upon receiving the energy, from the discharge burst of $C_1$, each pulse generator # 1– # N is charged therefrom in parallel through its charging inductance $L_1'$, series $SCR_1'$, and capacitance $C_1'$, FIG. 3. Thus all the pulse generators are simultaneously charged to store the energy of the discharge burst from $C_1$. The pulse generators are then sequentially discharged by triggering their further series switches $SCR_2'$, schematically illustrated at the gate electrode by 2', through the primary of their output transformers T, thus producing successive half-cycles or cycles of RF that in sequence make up each RF pulse of each group of pulses. This operation may be that described in said U.S. Pat. No. 3,889,263. Thus, for example, the successive half-cycle triggering of $SCR_2'$ in each successive pulse generator # 1 – # N, following the simultaneous charging of all the pulse generator capacitors $C_1'$ from the discharged capacitor $C_1$ of the first power supply via conductors 2 and ground, will collectively and sequentially produce the successive cycle portions constituting "RF Pulse # 1" in FIG. 2. When the next sequentially discharged power supply capacitor $C_2$ has simultaneously charged all the pulse generator capacitors $C_1'$, the sequential triggering of $SCR_2'$ in each pulse generator will collectively produce the next RF Pulse " # 2"; and so on for the group.

Other modes of sequential triggering of the pulse generators are also possible such as triggering different groups of the same on different half-cycles or cycles of the desired RF as disclosed in the lastnamed patent.

To provide a regulating control to effect any desired shaping or other characteristic variation in the RF pulse, the shunt $SCR_3'$ of each pulse generator, FIG. 3, may be controlled by a gating pulse at 3' to vary the actual amount of energy transferred from the power supply to that pulse generator.

A further advantage of the sequential power supply concept of the invention is its provision of latch-up prevention of the pulse generators in case of false triggering resulting from lightning or other electromagnetic pulse disturbances. Referring to the illustrative SCR pulse generator of FIG. 3, during such a disturbance, all of the SCR's in the circuit are turned on simultaneously. Each pulse circuit will thus form a low impedance to ground, as shown by the arrow in FIG. 3. This impedance is primarily inductive, consisting of the series interconnection of charging inductor $L_1'$ of the input saturable reactor-transformer, the second inductor $L_2$, the corresponding conductive series switches $SCR_1'$ and $SCR_2'$, and the primary winding of the output transformer T. Because this low impedance path is primarily inductive, the voltages on the sequential power supply capacitors $C_1$ through $C_N$ will reverse in polarity. These reverse voltages, in turn, are applied to the thyristors in the pulse generator circuits and the sequential power supply, causing them to recover and thereby restore normal operation of the circuit. To be able to perform this operation successfully, the charging inductor $L_1$ must be sufficiently larger such that the recovery of all of the SCR's has been accomplished before the power supply capacitors $C_1 - C_N$ are charged up again from the rectifier circuit R.

In successful experimental apparatus of the type shown in FIGS. 1 and 3, embodying eight sequential power supplies with pairs of half-cycle pulse generators, eight sequential and uniform pulses about a millisecond apart were faithfully generated at a repetition rate of twenty groups per second. For normal Loran C usage, eight such power supplies may be used; and for Loran D applications, sixteen sequential power supplies.

Further modifications will also occur to those skilled in this art, and such are considered to fall within the spirit and scope of the invention as defined in the appended claims.

What is claimed is:

1. A method of RF pulse generation, that comprises, charging a plurality of energy storage sources; sequentially discharging the sources to provide successive energy bursts; simultaneously transferring the energy of each burst to a further plurality of energy storage sources; and, following such transfer, sequentially discharging the further energy storage sources and generating successive cycles of an overall RF pulse corresponding to each burst.

2. A method as claimed in claim 1 and in which the first-named energy storage sources are charged simultaneously from a common source of voltage.

3. A method as claimed in claim 2 and in which the successive RF pulses corresponding to the successive energy bursts are transmitted in successive timed groups.

4. A method as claimed in claim 1 and in which the further step is performed of controlling the energy discharged by each of the first-named plurality of energy storage sources to insure equal energy bursts.

5. A method as claimed in claim 1 and in which the energy transferred to said further plurality of energy storage means is varied to shape the said overall RF pulse.

6. A method of RF pulse generation, that comprises, storing similar energy at a plurality of energy storage sources; sequentially releasing the energy from the sources to provide successive energy bursts; transferring the energy of each burst to a plurality of pulse generators of at least portions of a predetermined RF cycle; and, following such transfer, sequentially triggering the pulse generators to generate successive cycles of an overall RF pulse corresponding to each burst.

7. A sequential power supply apparatus for RF pulse generation and the like having, in combination, a plurality of energy storage power supplies; means for substantially simultaneously storing energy in the power supplies; a plurality of cycle pulse generators connected with the power supplies; means for sequentially transferring the energy of the power supplies successively to the pulse generators as successive energy bursts; and means operable following each such transfer for sequentially triggering the pulse generators to generate successive cycles of an overall RF pulse corresponding to each burst.

8. Apparatus as claimed in claim 7 and in which the transferring means and the triggering means are adjusted to produce successive timed groups of said RF pulses.

9. Apparatus as claimed in claim 8 and in which means is provided for transmitting said timed groups for Loran and related navigation use.

10. Apparatus as claimed in claim 7 and in which means is provided for equalizing the energy bursts transferred to the pulse generators.

11. Apparatus as claimed in claim 7 and in which means is provided for varying the energy at predetermined of said pulse generators to vary the shape of said overall RF pulse.

12. Apparatus as claimed in claim 7 and in which each power supply comprises capacitive charging and discharging means; and said energy transferring means comprises means for sequentially triggering said power supplies to effect sequential discharge thereof and enable feeding of the resulting sequential discharge bursts to said pulse generators.

13. Apparatus as claimed in claim 12 and in which each pulse generator comprises capacitive charging and discharging means, and said means for sequentially triggering the pulse generators comprises trigger means for sequentially discharging the pulse generator capacitive means to generate the successive cycle portions of said RF pulse.

14. Apparatus as claimed in claim 13 and in which means is provided for connecting said pulse generators with a common antenna coupling network.

15. Apparatus as claimed in claim 12 and in which at least one of said pulse generators is provided with shunt regulating means for varying the energy transferred thereto from the power supplies in order to vary characteristics of said RF pulse.

16. Apparatus as claimed in claim 7 and in which the said plurality of power supplies is at least eight in number.

* * * * *